United States Patent
Pandey et al.

(10) Patent No.: US 12,388,015 B2
(45) Date of Patent: Aug. 12, 2025

(54) E-FUSE WITH METAL FILL

(71) Applicant: GlobalFoundries U.S. Inc., Malta, NY (US)

(72) Inventors: Shesh M. Pandey, Saratoga Springs, NY (US); Rajendran Krishnasamy, Essex Junction, VT (US); Vibhor Jain, Williston, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 191 days.

(21) Appl. No.: 17/984,724

(22) Filed: Nov. 10, 2022

(65) Prior Publication Data

US 2024/0162146 A1    May 16, 2024

(51) Int. Cl.
*H01L 23/525* (2006.01)

(52) U.S. Cl.
CPC .................. *H01L 23/5256* (2013.01)

(58) Field of Classification Search
CPC ............... H01L 23/62; H01L 23/5256; H01L 2924/1453; H01L 23/525–5258; H01L 23/345; H10B 20/20–25; G11C 17/14–165
See application file for complete search history.

(56) References Cited

U.S. PATENT DOCUMENTS

| | | | |
|---|---|---|---|
| 3,699,403 A | 10/1972 | Boleky, III | |
| 6,333,546 B1 | 12/2001 | Marmillion et al. | |
| 6,958,523 B2 | 10/2005 | Babcock et al. | |
| 7,732,898 B2 | 6/2010 | Barth | |
| 7,817,455 B2 | 10/2010 | Fredeman et al. | |
| 7,960,809 B2 | 6/2011 | Kothandaraman et al. | |
| 8,236,655 B2 | 8/2012 | Barth et al. | |
| 9,093,453 B2 * | 7/2015 | Li | H01L 21/76877 |
| 2002/0033519 A1 | 3/2002 | Babcock et al. | |
| 2015/0097266 A1 | 4/2015 | Li et al. | |

OTHER PUBLICATIONS

Extended European Search Report dated Mar. 12, 2024 in EP Application No. 23198688.6-1211, 8 pages.

* cited by examiner

*Primary Examiner* — Steven B Gauthier
*Assistant Examiner* — Candice Chan
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to an e-fuse with metal fill structures and methods of manufacture. The structure includes: an insulator material; an e-fuse structure on the insulator material; a plurality of heaters on the insulator material and positioned on sides of the e-fuse structure; and conductive fill material within a space between the e-fuse structure and the plurality of heaters.

20 Claims, 5 Drawing Sheets

E-FUSE WITH METAL FILL

BACKGROUND

The present disclosure relates to semiconductor structures and, more particularly, to an e-fuse with metal fill structures and methods of manufacture.

An e-fuse (electronic fuse) is a microscopic fuse used in integrated circuits. This technology allows for the dynamic real-time reprogramming of semiconductor chips. By utilizing a set of e-fuses, for example, a chip manufacturer can allow for circuits to be programmed while they are in operation. An e-fuse, though, requires high current to program and requires a large area i.e. higher cost, for fabrication.

SUMMARY

In an aspect of the disclosure, a structure comprises: an insulator material; an e-fuse structure on the insulator material; a plurality of heaters on the insulator material and positioned on sides of the e-fuse structure; and conductive fill material within a space between the e-fuse structure and the plurality of heaters.

In an aspect of the disclosure, a structure comprises: an e-fuse structure comprising semiconductor material and sidewall spacers; a plurality of heaters comprising the semiconductor material and the sidewall spacers; and metal fill material within a space between the e-fuse structure and the plurality of heaters.

In an aspect of the disclosure, a method comprises: forming an e-fuse structure on insulator material; forming a plurality of heaters on the insulator material and positioned on sides of the e-fuse structure; and forming conductive fill material within a space between the e-fuse structure and the plurality of heaters.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an e-fuse with metal fill structures and methods of manufacture. More specifically, the present disclosure relates an e-fuse with metal fill structures between the e-fuse and heaters. Advantageously, by using the metal fill structures between the e-fuse and the heaters, the e-fuse becomes heated and, hence, requires a lower e-fuse programming current (e.g., >=10% reduction in blow current) and reduced chip area for e-fuse circuitry.

The e-fuse structure of the present disclosure can be manufactured in a number of ways using a number of different tools. In general, though, the methodologies and tools are used to form structures with dimensions in the micrometer and nanometer scale. The methodologies, i.e., technologies, employed to manufacture the e-fuse structure of the present disclosure have been adopted from integrated circuit (IC) technology. For example, the structures are built on wafers and are realized in films of material patterned by photolithographic processes on the top of a wafer. In particular, the fabrication of the e-fuse structure uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
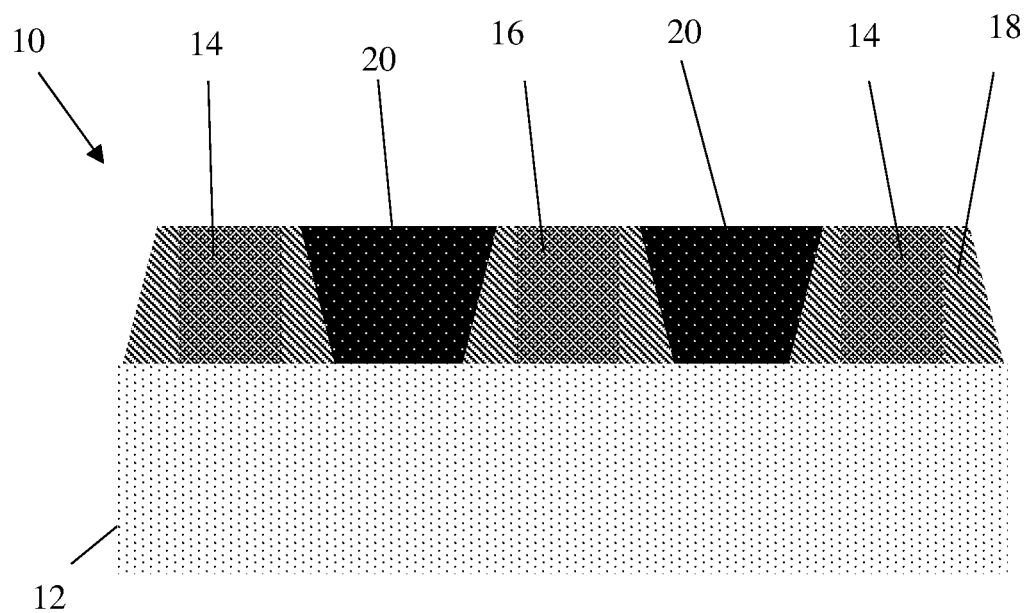
FIG. 1 shows an e-fuse with metal fill structures, amongst other features, and respective methods of fabricating the e-fuse structure with metal fill structures, in accordance with aspects of the present disclosure.

FIG. 1 shows an e-fuse with metal fill structures, amongst other features, and methods of fabricating the e-fuse structure with metal fill structures. More particularly, the structure 10 of FIG. 1 includes a plurality of heaters 14 adjacent to an e-fuse 16, each of which are formed on a shallow trench isolation structure 12. In embodiments, the e-fuse 16 is provided between the heaters 14. In further embodiments, the plurality of heaters 14 and e-fuse 16 may comprise semiconductor material, e.g., polysilicon material. It should be recognized by those of skill in the art that other semiconductor material is also contemplated for use such as, e.g., SiGe, Si, metal material, etc. The plurality of heaters 14 and e-fuse 16 may also include sidewall spacers 18. In embodiments, the sidewall spacers 18 may be, e.g., nitride and/or oxide materials. The shallow trench isolation structure 12 may be an insulator material, e.g., $SiO_2$.

A metal fill 20 may be provided between the e-fuse 16 and the plurality of heaters 14. In more specific embodiments, the metal fill 20 completely fills a space between the e-fuse 16 and the plurality of heaters 14. In this way, as in each of the embodiments, the metal fill 20, e-fuse 16 and plurality of heaters 14 are interdigitated above an isolation layer, e.g., shallow trench isolation structure 12.

The metal fill 20 may be any metal material that conducts heat from the plurality of heaters 14 to the e-fuse 16. For example, the metal fill 20 may be copper, aluminum, tungsten, etc., in direct contact with both the e-fuse 16 and the plurality of heaters 14. In further embodiments, the metal fill 20 may be any material that has a higher heat transfer conduction than insulator material. The metal fill 20 conducts heat from the heaters 14 to the e-fuse 16 which will effectively allow a lower e-fuse programming current (e.g., >=10% reduction in blow current) and, in turn, may also reduce chip area for e-fuse circuitry.

In fabricating the structure 10 of FIG. 1, the shallow trench isolation structure 12 may be formed by conventional lithography, etching and deposition methods known to those of skill in the art. For example, a resist formed over a substrate (e.g., semiconductor material) is exposed to energy (light) and developed utilizing a conventional resist developer to form a pattern (opening). An etching process with a selective chemistry, e.g., reactive ion etching (RIE), will be used to transfer the pattern from the photoresist to the substrate to form one or more trenches in the substrate through the openings of the resist.

Following the resist removal by a conventional oxygen ashing process or other known stripants, insulator material can be deposited by any conventional deposition processes, e.g., chemical vapor deposition (CVD) process. Any residual material on the surface of the substrate can be removed by a conventional chemical mechanical polishing (CMP) process.

The plurality of heaters 14 and the e-fuse 16 may be formed by depositing, e.g., using CVD processes, polysilicon material on the shallow trench isolation structure 12. Following the deposition process, the polysilicon material may be patterned using conventional lithography and etching processes as described herein to form the discrete structures of the heaters 14 and the e-fuse 16.

The sidewall spacers 18 may be formed on the heaters 14 and the e-fuse 16 by a blanket deposition process of nitride and/or oxide material, followed by an anisotropic etching process as is known in the art such that no further explanation is required for a complete understanding of the present disclosure. A metal material may be blanket deposited (e.g., using CVD processes) within the spaces between the heaters 14 and the e-fuse 16. A CMP process may be used to remove any excess metal material that formed on a top surface of the heaters 14 and the e-fuse 16.

Figure 2:
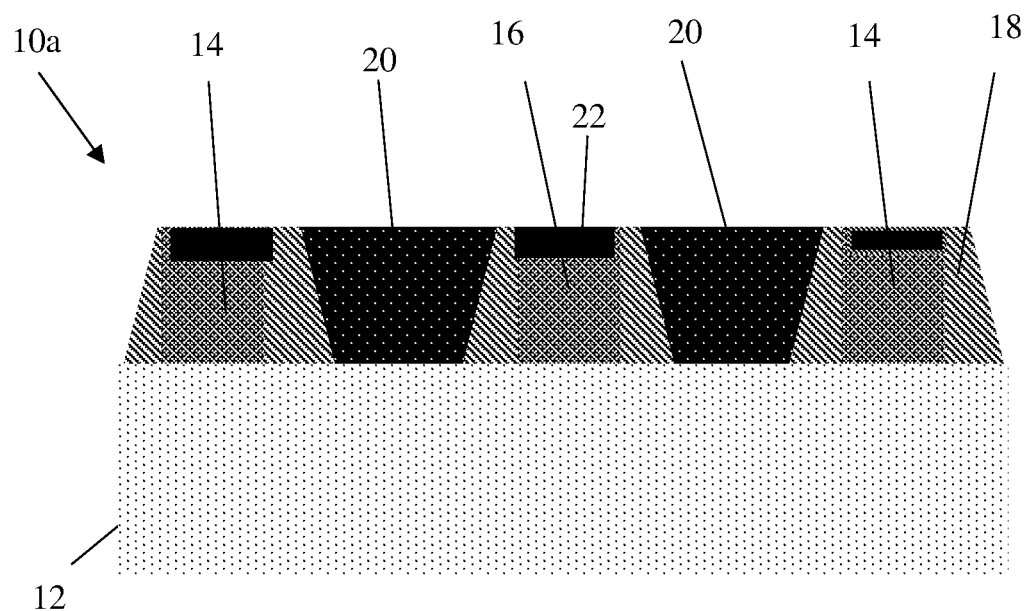
FIGS. 2-6 show cross-sectional views of an e-fuse with metal fill structures in accordance with additional aspects of the present disclosure.

FIG. 2 shows an e-fuse with metal fill structures in accordance with additional aspects of the present disclosure. In the structure 10a of FIG. 2, a silicide contact 22 may be formed on the heaters 14 and the e-fuse 16. The remaining features of the structure 10a are similar to the structure 10 of FIG. 1. It should also be recognized that the use of the silicide contacts 22 may be implemented in the other embodiments.

In embodiments, the silicide contacts 22 may be formed using a silicide process which begins with deposition of a thin transition metal layer, e.g., nickel, cobalt or titanium, over fully formed and patterned semiconductor material (e.g., heaters 14 and the e-fuse 16). After deposition of the material, the structure is heated allowing the transition metal to react with exposed semiconductor material of the heaters 14 and the e-fuse 16, thereby forming a low-resistance transition metal silicide. Following the reaction, any remaining transition metal is removed by chemical etching, leaving silicide contacts 22 on the heaters 14 and the e-fuse 16. It should be understood by those of skill in the art that silicide contacts will not be required on the metal fill 20.

Figure 3:
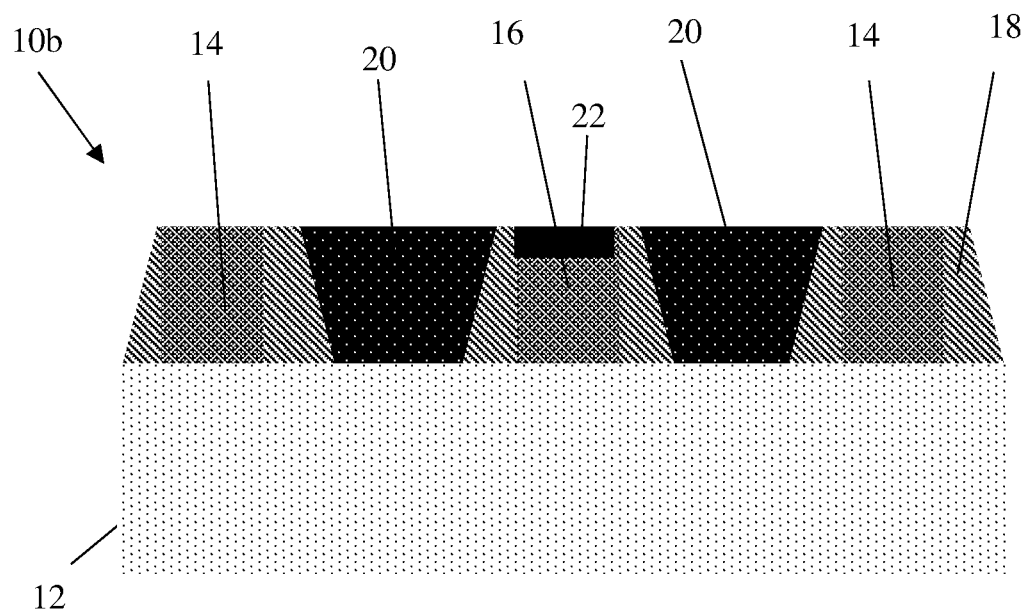

In FIG. 3, the structure 10b includes the silicide contact 22 only on the e-fuse 16. The remaining features of the structure 10b are similar to the structure 10 of FIG. 1. It should also be recognized that the use of the silicide contact 22 only on the e-fuse 16 may be implemented in the other embodiments.

Figure 4:
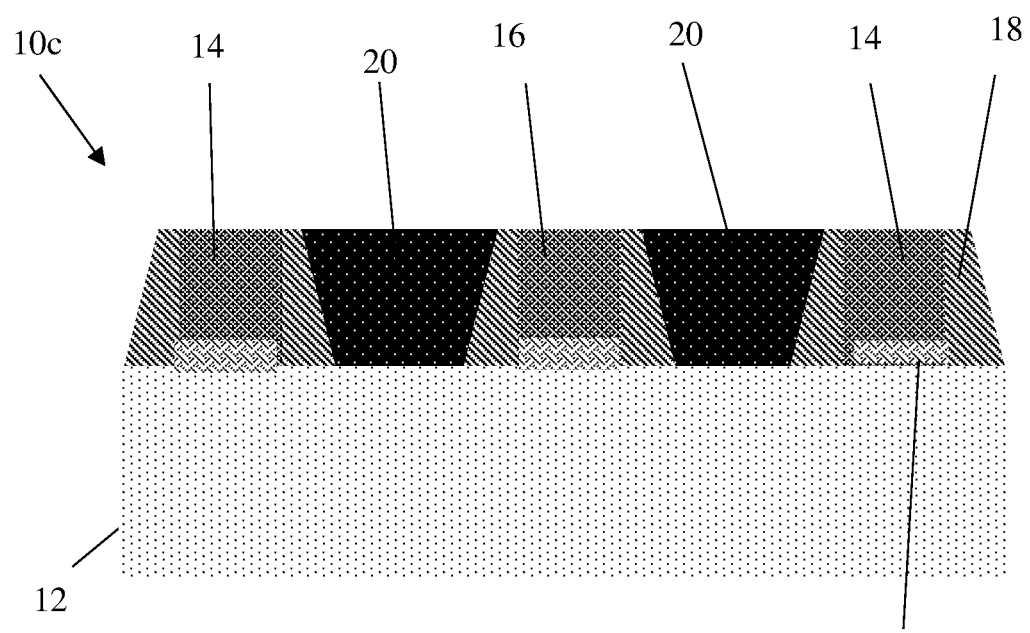

In FIG. 4, the structure 10c includes a dielectric material 24 under each of the plurality of heaters 14 and e-fuse 16. In embodiments, the dielectric material 24 may be a gate dielectric material. For example, the dielectric material 24 may be an oxide or a high-k dielectric material. The high-k dielectric material may be, for example, $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The remaining features of the structure 10c are similar to the structure 10 of FIG. 1. It should also be recognized that the use of the dielectric material 24 may be implemented in the other embodiments.

Figure 5:
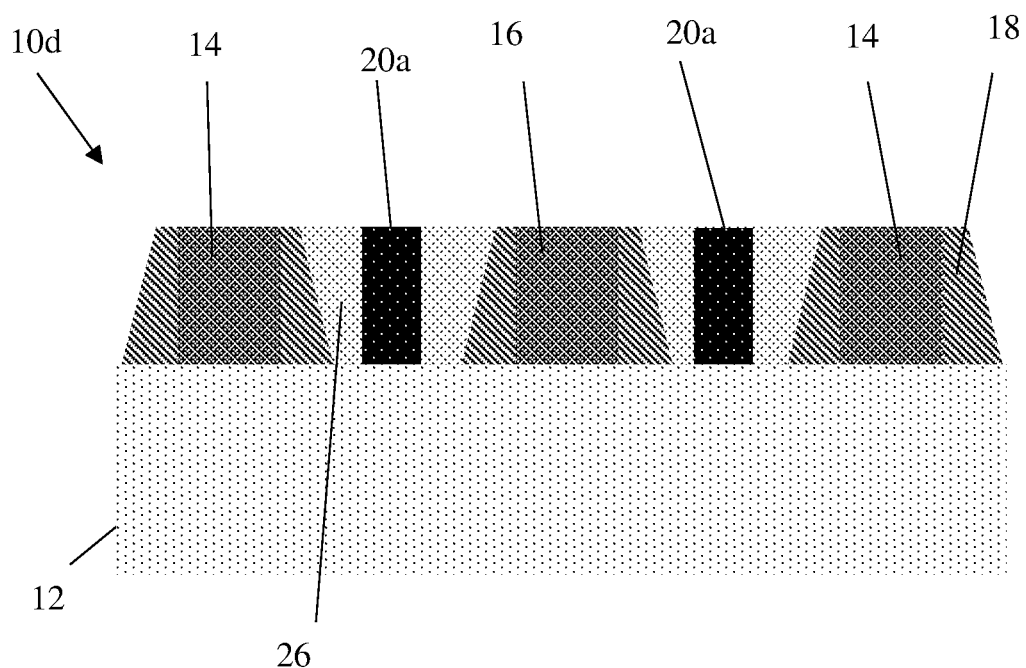

In FIG. 5, the structure 10d includes a dielectric material 26, e.g., $SiO_2$, between the plurality of heaters 14 and e-fuse 16, with a metal fill 20a within trenches formed in the dielectric material 26. The trenches may be formed by conventional lithography and etching processes, after the deposition of the dielectric material 26. Unlike the structure 10 shown in FIG. 1, the metal fill 20a does not completely fill the space between the plurality of heaters 14 and e-fuse 16. The remaining features of the structure 10d are similar to the structure 10 of FIG. 1.

Figure 6:
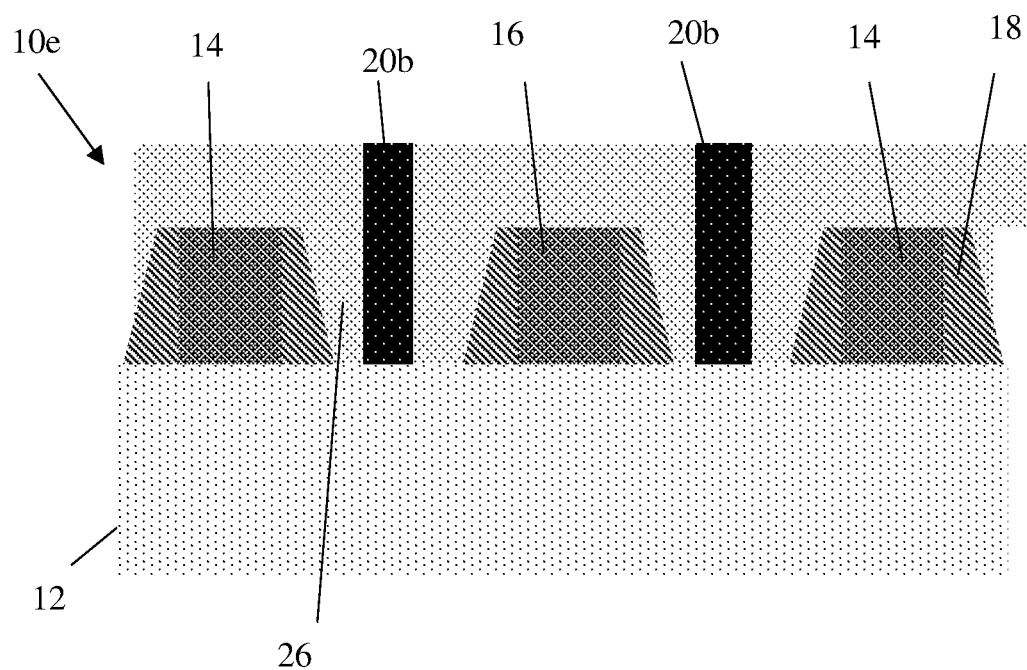

In FIG. 6, the structure 10e includes the metal fill 20b within the dielectric material 26, e.g., $SiO_2$, and at a height above a top surface of the plurality of heaters 14 and e-fuse 16. The remaining features of the structure 10e are similar to the structure 10d of FIG. 5. It should also be recognized that the configuration of the metal fill 20b may be implemented in the other embodiments.

Figure 7:
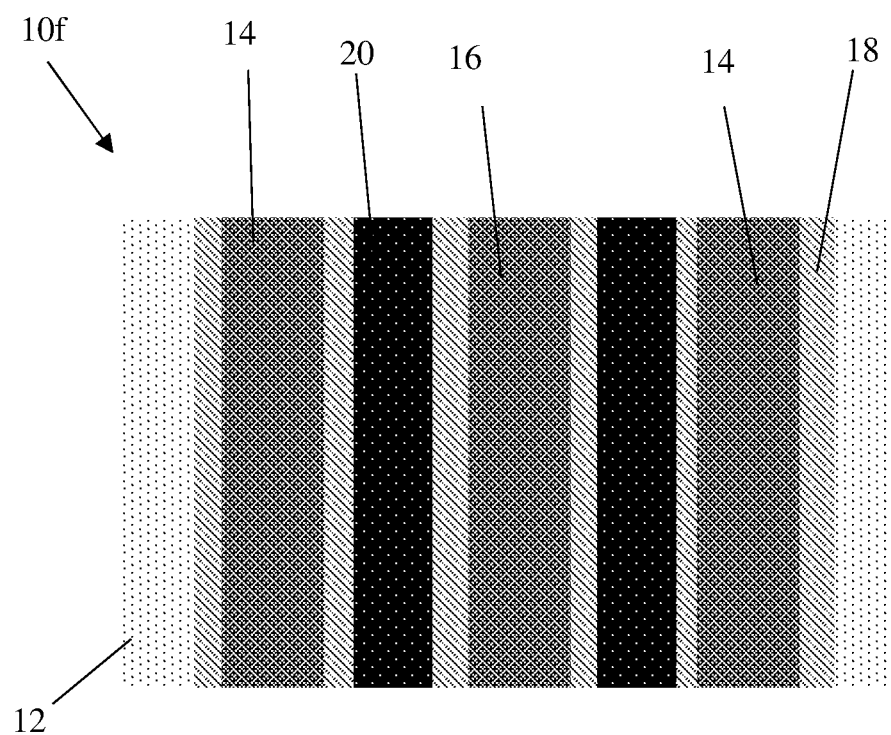
FIGS. 7-9 show top views of an e-fuse with metal fill structures in accordance additional with aspects of the present disclosure.

FIG. 7 shows a top view of an e-fuse with metal fill structures in accordance with aspects of the present disclosure. In the structure 10f of FIG. 7, the metal fill 20 extends along an entire length between the plurality of heaters 14 and e-fuse 16. The remaining features of the structure 10f are similar to the structure 10 of FIG. 1. It should also be recognized that the configuration of the metal fill 20 may be implemented in the other embodiments.

Figure 8:
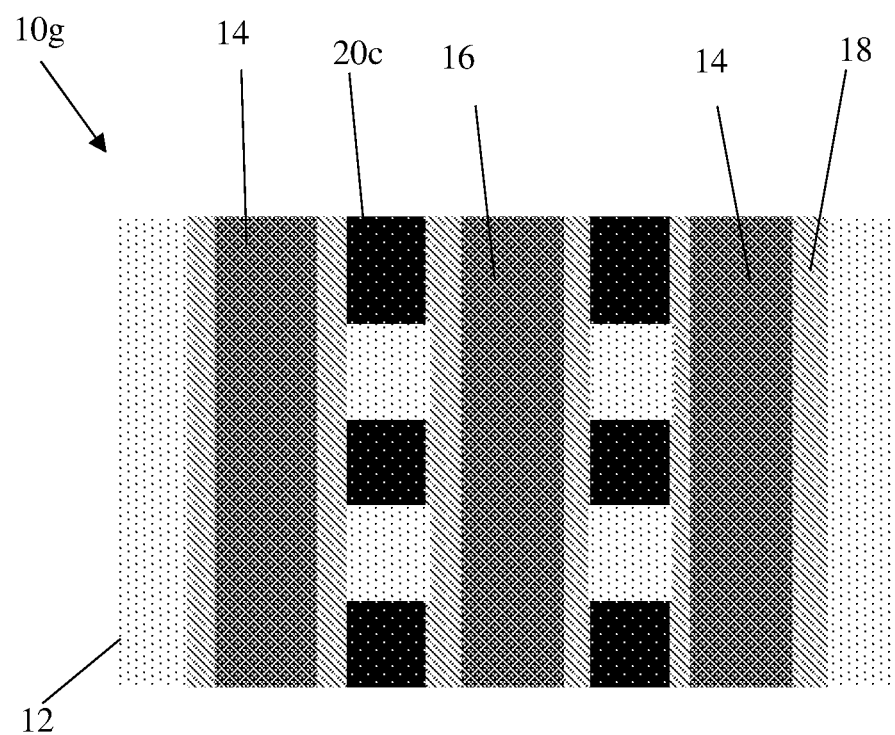

In FIG. 8, the structure 10g includes discrete islands 20c of the metal fill, along the length between the plurality of heaters 14 and e-fuse 16. The remaining features of the structure 10g are similar to the structure 10 of FIG. 1. It should also be recognized that the configuration of the discrete islands 20c of the metal fill may be implemented in the other embodiments.

Figure 9:
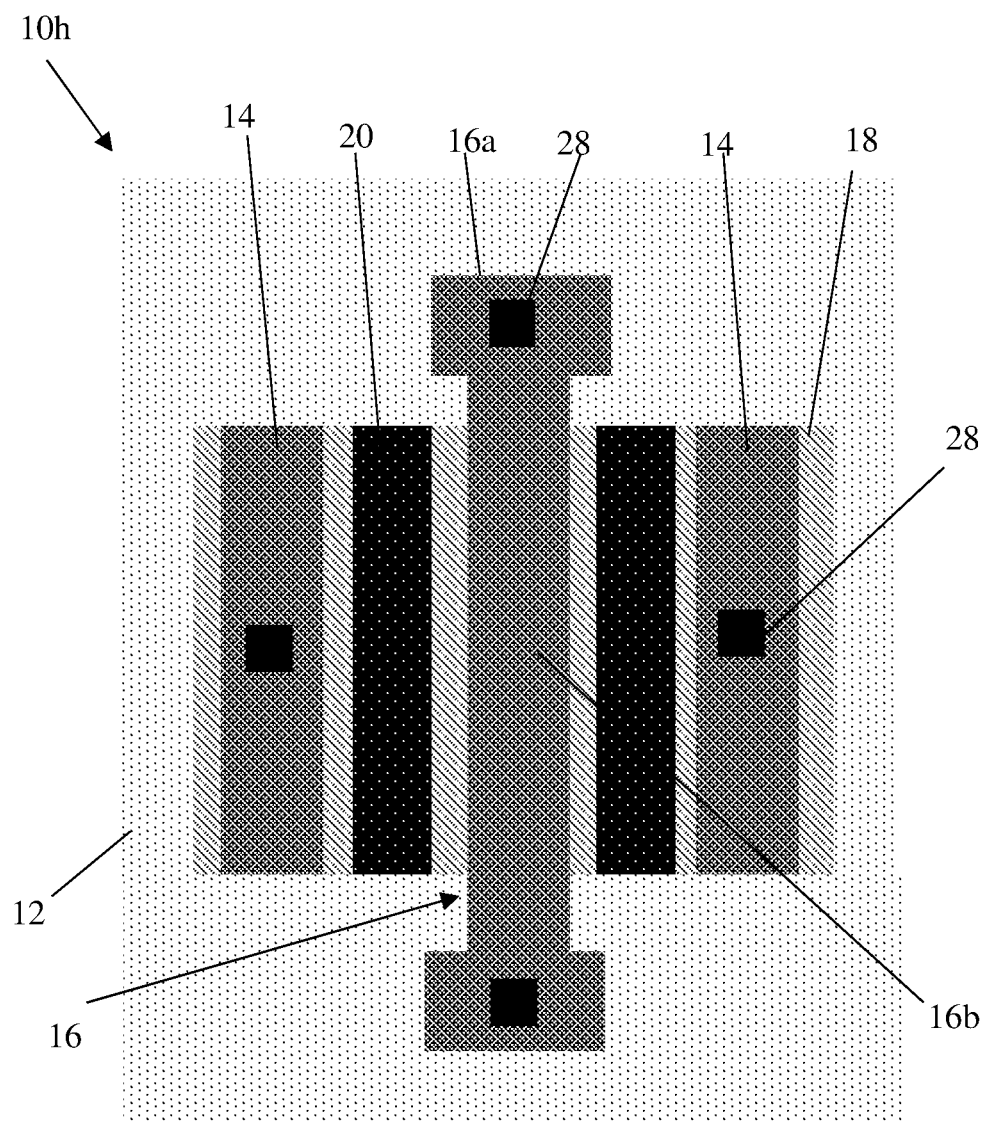

FIG. 9 shows a top view of an e-fuse with metal fill structures in accordance with additional aspects of the present disclosure. In the structure 10h of FIG. 9, the e-fuse 16 includes upper and lower thicker portions 16a and a thinner portion 16b between the upper and lower thick portions 16a. The upper and lower thicker portions 16a may be, e.g., a cathode and an anode, and may include a contact 28. The contact 28 may also be provided on the heaters 14. The metal fill 20 extends along a length of the plurality of heaters 14 and the thinner portion 16b of the e-fuse 16. The remaining features of the structure 10h are similar to the structure 10 of FIG. 1.

The e-fuse with metal fill structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
an insulator material;
an e-fuse structure on the insulator material and comprising insulator sidewall spacers;
a plurality of heaters on the insulator material and also comprising the insulator sidewall spacers, the plurality of heaters being positioned on sides of the e-fuse structure; and
conductive metal fill material within a space defined between the insulator sidewall spacers of the e-fuse structure and the plurality of heaters.

2. The structure of claim 1, wherein the conductive metal fill material completely fills the space between the e-fuse structure and the plurality of heaters.

3. The structure of claim 2, wherein the conductive metal fill material contacts both insulator sidewall spacers of the e-fuse structure and the plurality of heaters.

4. The structure of claim 1, wherein the conductive metal fill material comprise discrete islands between the e-fuse structure and the plurality of heaters.

5. The structure of claim 1, wherein the metal conductive fill material extends above a surface of the e-fuse structure and the plurality of heaters.

6. The structure of claim 1, wherein the conductive metal fill material partially fills a space between the e-fuse structure and the plurality of heaters.

7. The structure of claim 6, further comprising insulator material between the conductive metal fill material and the e-fuse structure and the plurality of heaters.

8. The structure of claim 1, further comprising a silicide contact on the e-fuse structure and the plurality of heaters.

9. The structure of claim 1, further comprising a silicide contact on the e-fuse structure.

10. The structure of claim 1, further comprising a gate dielectric material under the e-fuse structure and the plurality of heaters.

11. The structure of claim 1, wherein the e-fuse comprises an anode, a cathode and a portion extending between the anode and the cathode, and the conductive fill material extends along a length of the portion between the anode and the cathode.

12. A structure comprising:
an e-fuse structure comprising semiconductor material and sidewall spacers;
a plurality of heaters comprising the semiconductor material and the sidewall spacers; and
metal fill material within a space between the sidewall spacers of the e-fuse structure and the plurality of heaters.

13. The structure of claim 12, wherein the metal fill material completely fills the space between the e-fuse structure and the plurality of heaters.

14. The structure of claim 12, wherein the metal fill material partially fills the space between the e-fuse structure and the plurality of heaters.

15. The structure of claim 12, wherein the metal fill material comprise discrete islands between the e-fuse structure and the plurality of heaters.

16. Structure of claim 12, wherein the metal fill material, the e-fuse structure and the plurality of heaters are on an isolation material.

17. The structure of claim 12, wherein the metal fill material extends along a length of the e-fuse structure between an anode and a cathode of the e-fuse structure.

18. The structure of claim 12, further comprising silicide contacts on at least the e-fuse structure.

19. The structure of claim 12, wherein the e-fuse structure and its sidewall spacers, the plurality of heaters and its sidewall spacers and the metal fill material have planar surfaces, the metal fill material comprises slanted sidewalls with a thinner portion at a bottom and a thicker portion at a top, and a silicide contact at an upper surface of the plurality of heaters which are also planar with the sidewall spacers and the metal fill material.

20. A method comprises:
forming an e-fuse structure on insulator material and comprising insulator sidewall spacers;
forming a plurality of heaters on the insulator material and also comprising the insulator sidewall spacers, the plurality of heaters being positioned on sides of the e-fuse structure; and
forming conductive metal fill material within a space defined between the insulator sidewall spacers of the e-fuse structure and the plurality of heaters.

* * * * *